(12) United States Patent
Kwon et al.

(10) Patent No.: US 7,522,009 B2
(45) Date of Patent: Apr. 21, 2009

(54) OSCILLATION STABILIZATION CIRCUIT (75) Inventors: Yong Il Kwon, Suwon (KR); Myeung Su Kim, Suwon (KR); Tah Joon Park, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 127 days.

(21) Appl. No.: 11/808,516

(22) Filed: Jun. 11, 2007

(65) Prior Publication Data
US 2007/0296514 A1 Dec. 27, 2007

(30) Foreign Application Priority Data
Jun. 12, 2006 (KR) .............. 10-2006-0052471

(51) Int. Cl.
*H03L 1/00* (2006.01)
(52) U.S. Cl. ............. 331/175; 331/176; 331/16; 331/185
(58) Field of Classification Search ............ 331/8, 331/16, 175–176, 185
See application file for complete search history.

(56) References Cited

U.S. PATENT DOCUMENTS 3,838,357 A * 9/1974 Billeg, Jr. .................. 331/74
2004/0212444 A1* 10/2004 Peng ....................... 331/175
2005/0195044 A1 9/2005 Hitomi et al.

FOREIGN PATENT DOCUMENTS

KR 10-0278279 10/2000

* cited by examiner

*Primary Examiner*—Anh Q Tran

(57) ABSTRACT

An oscillation stabilization detecting circuit comprises a T flip flop receiving a pulse-type oscillation signal generated by oscillating a crystal oscillator and then dividing the oscillation signal to output; a pulse control unit including inverters and transistors, the pulse control unit converting the signal output from the T flip flop into a pulse-type signal starting from a high level and then outputting the converted signal; and an oscillation stabilization detecting unit including a capacitor charged with the signal output from the pulse control unit; and a plurality of transistors. The oscillation stabilization detecting unit controls charging time of the capacitor by adjusting a bias current and, after the charging time passes, outputs a stabilization signal to a CPU, the stabilization signal representing that the oscillation signal is stabilized.

13 Claims, 7 Drawing Sheets

OSCILLATION STABILIZATION CIRCUIT

CROSS-REFERENCE TO RELATED APPLICATIONS

This application claims the benefit of Korean Patent Application No. 10-2006-0052471 filed with the Korea Intellectual Property Office on Jun. 12, 2006, the disclosure of which is incorporated herein by reference.

BACKGROUND OF THE INVENTION

1. Field of the Invention

The present invention relates to an oscillation stabilization circuit which can control time, at which an oscillation signal is stabilized, by adjusting a bias current such that the time for stabilization of oscillation signal can be advanced. The oscillation stabilization circuit can detect accurate stabilization time and can notice the time to a CPU (Control Processing Unit), thereby enhancing operational efficiency of the CPU.

2. Description of the Related Art

In general, IC elements use an oscillation signal generated from a crystal oscillator provided outside.

However, since the crystal oscillator oscillates using noise when initially operating, it takes a long time until an oscillation signal is stabilized, and accurate stabilization time cannot be noticed to a CPU. Therefore, time required for the operation of the CPU is significantly wasted. Accordingly, there is a need for a circuit which, when an oscillation signal generated from the crystal oscillator is stabilized, can notice the information.

Figure 1:
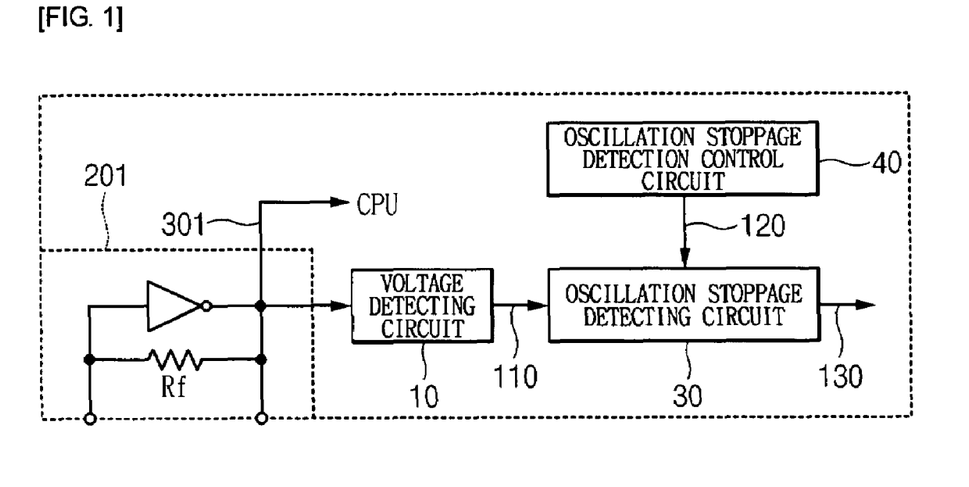
FIG. 1 is a block diagram of a conventional oscillation stabilization detecting circuit.

FIG. 1 is a block diagram of a conventional oscillation stabilization detecting circuit. As shown in FIG. 1, the conventional oscillation stabilization detecting circuit includes a crystal oscillating section 210, a voltage detecting circuit 10, an oscillation stoppage detecting section 30, and an oscillation stoppage detection control circuit 40.

Figure 2:
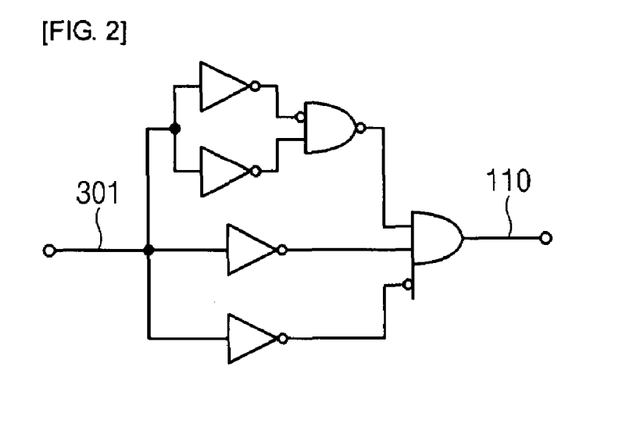
FIG. 2 is a circuit diagram of a voltage detecting circuit of FIG. 1.
Figure 3:
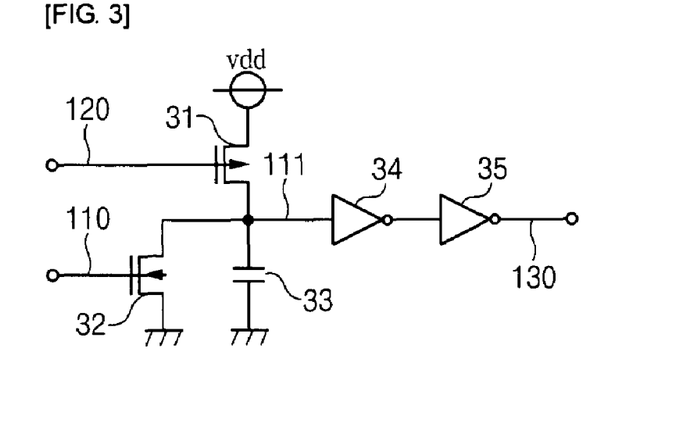
FIG. 3 is a circuit diagram of an oscillation stoppage detecting circuit FIG. 1.
Figure 4:
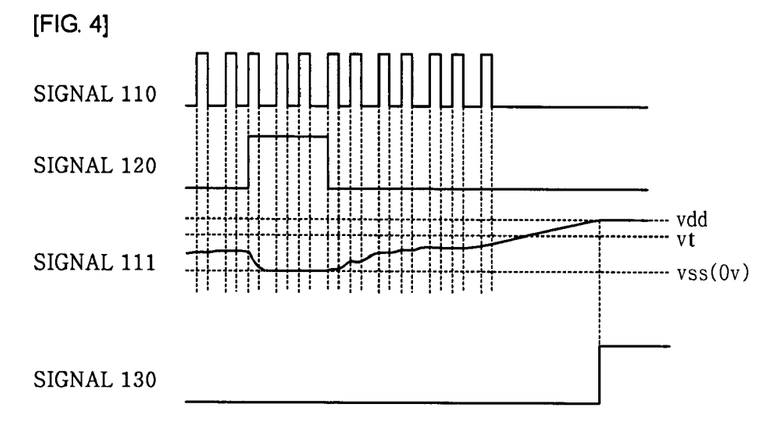
FIG. 4 is a diagram showing signals generated from the conventional oscillation stabilization detecting circuit.

The conventional oscillation stabilization detecting circuit constructed in such a manner generates such signals as shown in FIG. 4. The voltage detecting circuit 10 is configured in such a manner as shown in FIG. 2, and the oscillation stoppage detecting circuit 30 is configured in such a manner as shown in FIG. 3.

Referring to FIGS. 1 to 4, an operational process of the conventional oscillation stabilization detecting circuit will be described as follows.

First, when crystal is oscillated by the crystal oscillating section 201, an oscillation signal 301 output from the crystal oscillating section 201 is detected by the voltage detecting circuit 10. The voltage detecting circuit 10 outputs a stabilization signal 130 by using the detected signal 110, the stabilization signal 130 representing that the oscillation signal is stabilized.

More specifically, the oscillation signal 301 output from the crystal oscillating section 201 is output to a CPU. The CPU converts the oscillation signal into a digital signal. The voltage detecting circuit 10 detects the signal 110 having the shape of a signal 110 shown in FIG. 4 and then outputs the signal to a transistor 32 of the oscillation stoppage detecting circuit 30.

Further, the oscillation stoppage detecting circuit 30 receives the signal 110 detected by the voltage detecting circuit 10 and a signal 120 of the oscillation stoppage detection control circuit 40, the signal 120 having the shape of a signal 120 shown in FIG. 4. Accordingly, as the time passes, a capacitor 33 of the oscillation stoppage detecting circuit 30 is charged in the form of a signal 111 shown in FIG. 4.

At this time, when the charged voltage 111 becomes equal to or more than a critical voltage, a stabilization signal having the shape of a signal 130 shown in FIG. 4 is output to the CPU by buffers 34 and 35. Through the output stabilization signal, the CPU recognizes that the oscillation signal is stabilized and then operates.

However, the conventional stabilization detecting circuit cannot control the charging time of the capacitor such that the time at which oscillation signal is stabilized cannot be adjusted. Accordingly, it is impossible to advance the time for stabilization of oscillation signal.

Further, since the time for stabilization of oscillation signal cannot be adjusted, it is difficult to detect accurate stabilization time, and thus accurate stabilization time cannot be noticed to the CPU. Therefore, a lot of time is wasted for the operation of the CPU such that operational efficiency of the CPU is degraded.

SUMMARY OF THE INVENTION

An advantage of the present invention is that it provides an oscillation stabilization detecting circuit which controls time for stabilization of oscillation signal by adjusting a bias current such that the time for stabilization of oscillation signal can be advanced.

Another advantage of the invention is that it provides an oscillation stabilization detecting circuit which can notice accurate stabilization time to a CPU, thereby enhancing operational efficiency of the CPU.

Additional aspect and advantages of the present general inventive concept will be set forth in part in the description which follows and, in part, will be obvious from the description, or may be learned by practice of the general inventive concept.

According to an aspect of the invention, an oscillation stabilization detecting circuit comprises a T flip flop receiving a pulse-type oscillation signal generated by oscillating a crystal oscillator and then dividing the oscillation signal to output; a pulse control unit including inverters and transistors, the pulse control unit converting the signal output from the T flip flop into a pulse-type signal starting from a high level and then outputting the converted signal; and an oscillation stabilization detecting unit including a capacitor charged with the signal output from the pulse control unit; and a plurality of transistors. The oscillation stabilization detecting unit controls charging time of the capacitor by adjusting a bias current and, after the charging time passes, outputs a stabilization signal to a CPU, the stabilization signal representing that the oscillation signal is stabilized.

Preferably, each of the transistors is provided with first to third terminals. Based on the magnitude of a voltage applied between the first and second terminals, the magnitude and direction of a current flowing from the second terminal to the third terminal are changed, and the first to third terminals are a gate, a source, and a drain, respectively.

Preferably, the oscillation stabilization detecting unit includes a capacitor; a bias current control section generating a bias current and controlling the magnitude of the bias current by using transistors; a first mirroring section mirroring the bias current output from the bias current control section; a second mirroring section connected to the first mirroring section and mirroring the bias current mirrored by the first mirroring section; a third mirroring section connected to the second mirroring section and mirroring the bias current mirrored by the second mirroring section; a capacitor charging section connected to the pulse control unit so as to charge the capacitor for the charging time controlled by the signal output from the pulse control unit; a comparator comparing the voltage charged in the capacitor with a reference voltage generated by the bias current mirrored through the third mirroring section; and an inverter inverting the signal output from the comparator and then outputting a stabilization signal to a CPU, the stabilization signal representing that the oscillation signal is stabilized.

Preferably, the capacitor charging section includes first and second PMOS transistors. The gates of the first and second PMOS transistors receive a signal output from the pulse control unit, the sources thereof are connected to the second mirroring section, the drain of the first PMOS transistor is grounded, and the drain of the second PMOS transistor is connected to the capacitor.

Preferably, when the signal output from the pulse control unit is switched from a high level to a low level, the second PMOS transistor is turned on to charge the capacitor.

Preferably, the comparator includes a third PMOS transistor and a first NMOS transistor. The gate of the third PMOS transistor receives the voltage charged in the capacitor, the source thereof receives a power supply voltage, and the drain thereof is connected to the drain of the first NMOS transistor. The gate of the first NMOS transistor receives the reference voltage, the source thereof is grounded, and the drain thereof is connected to the drain of the third PMOS transistor.

Preferably, when the voltage charged in the capacitor is larger than the reference voltage, the third PMOS transistor is turned off and the first NMOS transistor is turned on so that the comparator outputs a low-level signal.

Preferably, the inverter outputs a high-level stabilization signal to the CPU.

Preferably, the oscillation stabilization detecting unit includes a capacitor; a bias current control section generating a bias current and controlling the magnitude of the bias current by using transistors; a first mirroring section mirroring the bias current output from the bias current control section; a second mirroring section connected to the first mirroring section and mirroring the bias current mirrored by the first mirroring section; a third mirroring section connected to the second mirroring section and mirroring the bias current mirrored by the second mirroring section; a capacitor charging section connected to the pulse control unit so as to charge the capacitor for the charging time controlled by the signal output from the pulse control unit; and a comparator comparing the voltage charged in the capacitor with a reference voltage generated by the bias current mirrored through the third mirroring section and then outputting a stabilization signal to a CPU, the stabilization signal representing that the oscillation signal is stabilized.

Preferably, the capacitor charging section includes first and second PMOS transistors. The gates of the first and second PMOS transistors receive a signal output from the pulse control unit, the sources thereof are connected to the second mirroring section, the drain of the first PMOS transistor is grounded, and the drain of the second PMOS transistor is connected to the capacitor.

Preferably, when the signal output from the pulse control unit is switched from a high level to a low level, the second PMOS transistor is turned on to charge the capacitor.

Preferably, the comparator includes a third PMOS transistor and a first NMOS transistor. The gate of the third PMOS transistor receives the voltage charged in the capacitor, the source thereof receives a power supply voltage, and the drain thereof is connected to the drain of the first NMOS transistor. The gate of the first NMOS transistor receives the reference voltage, the source thereof is grounded, and the drain thereof is connected to the drain of the third PMOS transistor.

Preferably, when the voltage charged in the capacitor is larger than the reference voltage, the third PMOS transistor is turned off and the first NMOS transistor is turned on so that the comparator outputs a low-level stabilization signal to the CPU.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Before the invention is described, the configuration of an oscillation stabilization detecting circuit according to the invention will be described briefly. The oscillation stabilization detecting circuit employs a plurality of transistors. Each of the transistors is provided with a gate, a source, and a drain. In such a transistor, the magnitude and direction of a current flowing from the drain to the source or from the source to the drain is determined by the magnitude and polarity of a voltage applied between the gate and the source.

As for the transistors, there are provided a bipolar junction transistor (BJT), a junction gate field-effect transistor (JFET), a metal-oxide-semiconductor transistor (hereinafter, referred to as 'MOS transistor'), a metal-semiconductor field-effect transistor (MESFET) and the like.

The following descriptions will be focused on the MOS transistor. However, the invention can be applied to all the transistors having the above-described characteristic as well as the MOS transistor. Therefore, although the descriptions of the invention are focused on the MOS transistor, the scope of the invention is not limited to the MOS transistor.

Hereinafter, an oscillation stabilization detecting circuit according to the present invention will be described in detail with reference to the accompanying drawings.

Figure 5A:
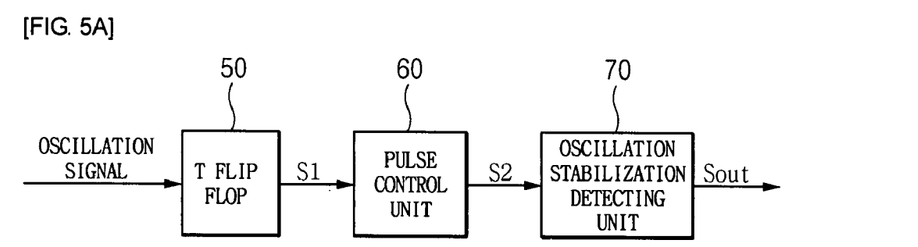
FIG. 5A is a block diagram of an oscillation stabilization detecting circuit according to the present invention.

FIG. 5A is a block diagram of the oscillation stabilization detecting circuit according to the invention. As shown in FIG. 5A, the oscillation stabilization detecting circuit includes a T flip flop 50, a pulse control unit 60, and an oscillation stabilization detecting unit 70.

Figure 5B:
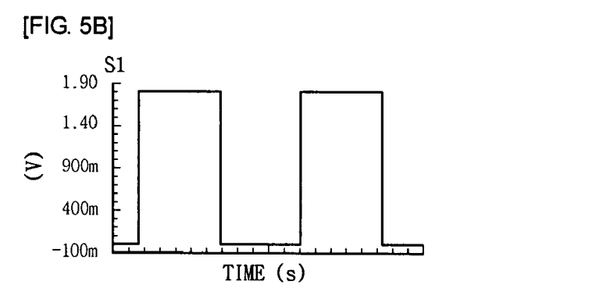
FIG. 5B is a diagram showing a signal output from a T flip flop of FIG. 5A.

The T flip flop 50 receives a pulse-type oscillation signal generated by oscillating a crystal oscillator (not shown) and divides the oscillation signal to output. At this time, the output signal S1 has a shape shown in FIG. 5B.

Figure 5C:
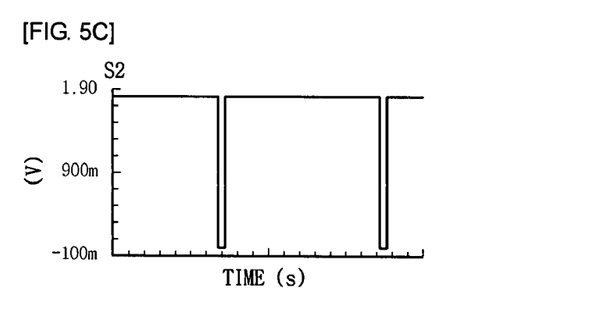
FIG. 5C is a diagram showing a signal output from a pulse control unit of FIG. 5A.

Further, the pulse control unit 60 converts the signal S1 output from the T flip flop 50 into a pulse-type signal S2 starting from a high level and then outputs the converted signal 52. The output signal S2 has a shape shown in FIG. 5C.

The pulse control unit 60 should output the pulse-type signal S2 starting from a high level, in order to prevent a capacitor of the oscillation stabilization detecting circuit 70 from being charged at the initial stage. If an output of the pulse control unit 60 starts from a low level, the capacitor is immediately charged at the initial stage such that the charging time cannot be controlled. Then, time at which the oscillation signal is stabilized cannot be adjusted. A process where the charging time is controlled will be described when the oscillation stabilization detecting unit 70 is described.

Figure 6:
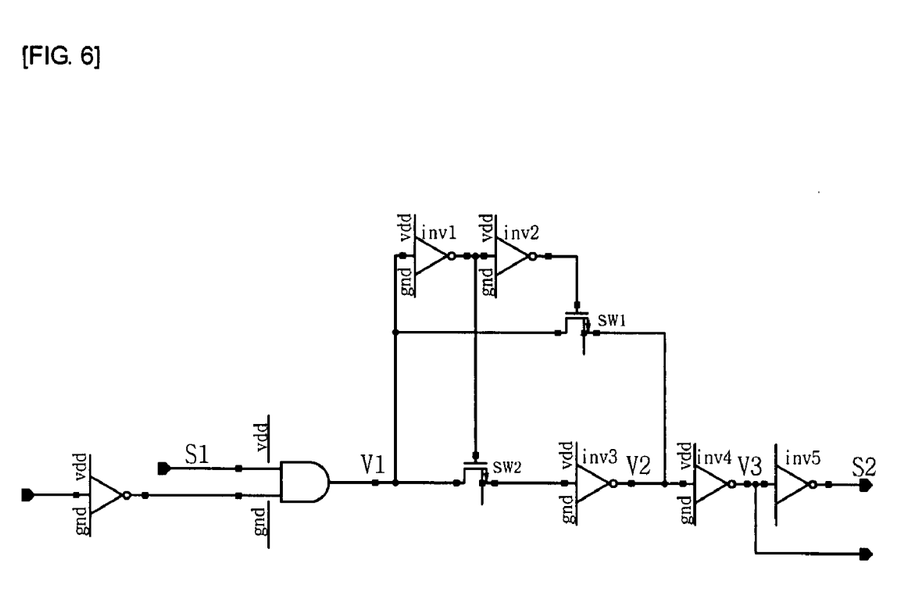
FIG. 6 is a circuit diagram of the pulse control unit of FIG. 5A.

The pulse control unit 60 includes inverters and MOS transistors. The pulse control unit 60 can be implemented in such a manner shown in FIG. 6. In FIG. 6, the descriptions will be focused on an embodiment using NMOS transistors. However, the invention is not limited to a specific type of MOS transistor. PMOS transistors or both of PMOS transistors and NMOS transistors can be used to implement substantially the same operation.

Referring to FIG. 6, the operation of the pulse control unit 60 will be described as follows.

When a signal S1 output from the T flip flop 50 starts from a high level, the high-level signal V1 is inverted by an inverter inv1 such that a low-level signal is applied to the gate of a MOS transistor SW2. Therefore, the MOS transistor SW2 is turned off, and the low-level signal is inverted by an inverter inv2 such that a high-level signal is applied to the gate of a MOS transistor SW1. Then, the MOS transistor SW1 is turned on.

Accordingly, a voltage V2 of a node connected to the source of the MOS transistor SW1 becomes a high-level signal. The high-level signal V2 is inverted into a low-level signal V3 by an inverter inv4 and is again inverted by an inverter inv5. Finally, a signal S2 starting from a high level is output.

When the signal S1 output from the T flip flop 50 starts from a low level, the low-level signal V1 is inverted by the inverter inv1 such that a high-level signal is applied to the gate of the MOS transistor SW2. Therefore, the MOS transistor SW2 is turned on, and the high-level signal is again inverted by the inverter inv2 such that a low-level signal is applied to the gate of the MOS transistor SW1. Then, the MOS transistor SW1 is turned off.

Accordingly, the low-level signal V1 transmitted through the MOS transistor SW2 is inverted into a high-level signal V2 by the inverter inv3. The high-level signal V2 is inverted into a low-level signal V3 by the inverter inv4 and is again inverted by the inverter inv5. Finally, a signal S2 starting from a high level is output.

As described above, it can be found that, regardless of which level a signal applied to the pulse control unit 60 starts from, a signal S2 to be finally output from the pulse control unit 60 is a pulse-type signal starting from a high level.

Meanwhile, the oscillation stabilization detecting unit 70 includes a capacitor, which is charged by the signal S2 output from the pulse control unit 60, and a plurality of transistors. The oscillation stabilization detecting unit 70 controls charging time of the capacitor by adjusting a bias current. After the charging time passes, the oscillation stabilization detecting unit 70 outputs a stabilization signal Sout to a CPU, the stabilization signal Sout representing that the oscillation signal is stabilized.

Depending on the configuration of the oscillation stabilization detecting unit 70, the present invention can be implemented into a variety of embodiments. Hereinafter, the oscillation stabilization circuit according to the embodiments of the invention will be described in detail with reference to the accompanying drawings.

First Embodiment

Figure 7:
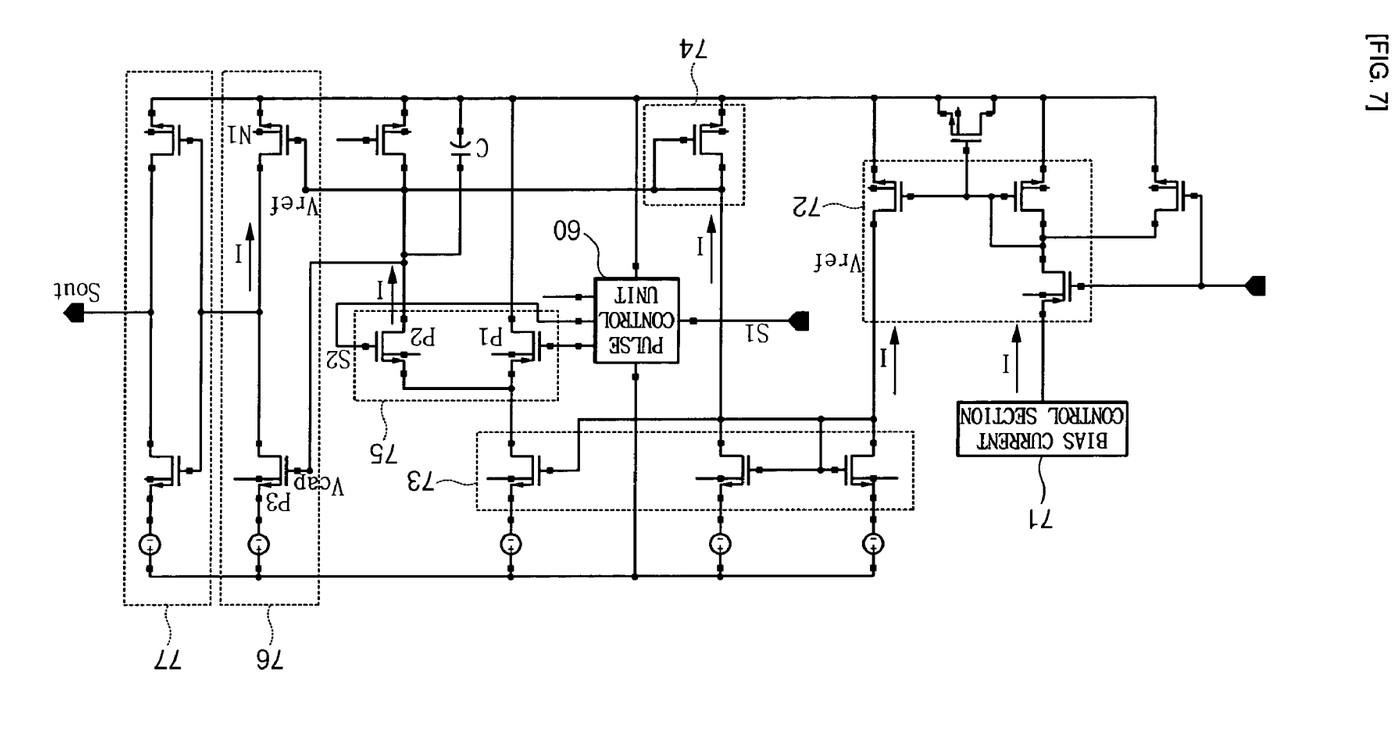
FIG. 7 is a circuit diagram of an oscillation stabilization detecting unit of FIG. 5A according to a first embodiment of the invention.

FIG. 7 is a circuit diagram of an oscillation stabilization detecting unit according to a first embodiment of the invention. As shown in FIG. 7, the oscillation stabilization detecting unit includes a capacitor C, a bias current control section 71, a first mirroring section 72, a second mirroring section 73, a third mirroring section 74, a capacitor charging section 75, a comparator 76, and an inverter 77.

The bias current control section 71 generates a bias current I and controls the magnitude of the bias current I by using MOS transistors.

Figure 8:
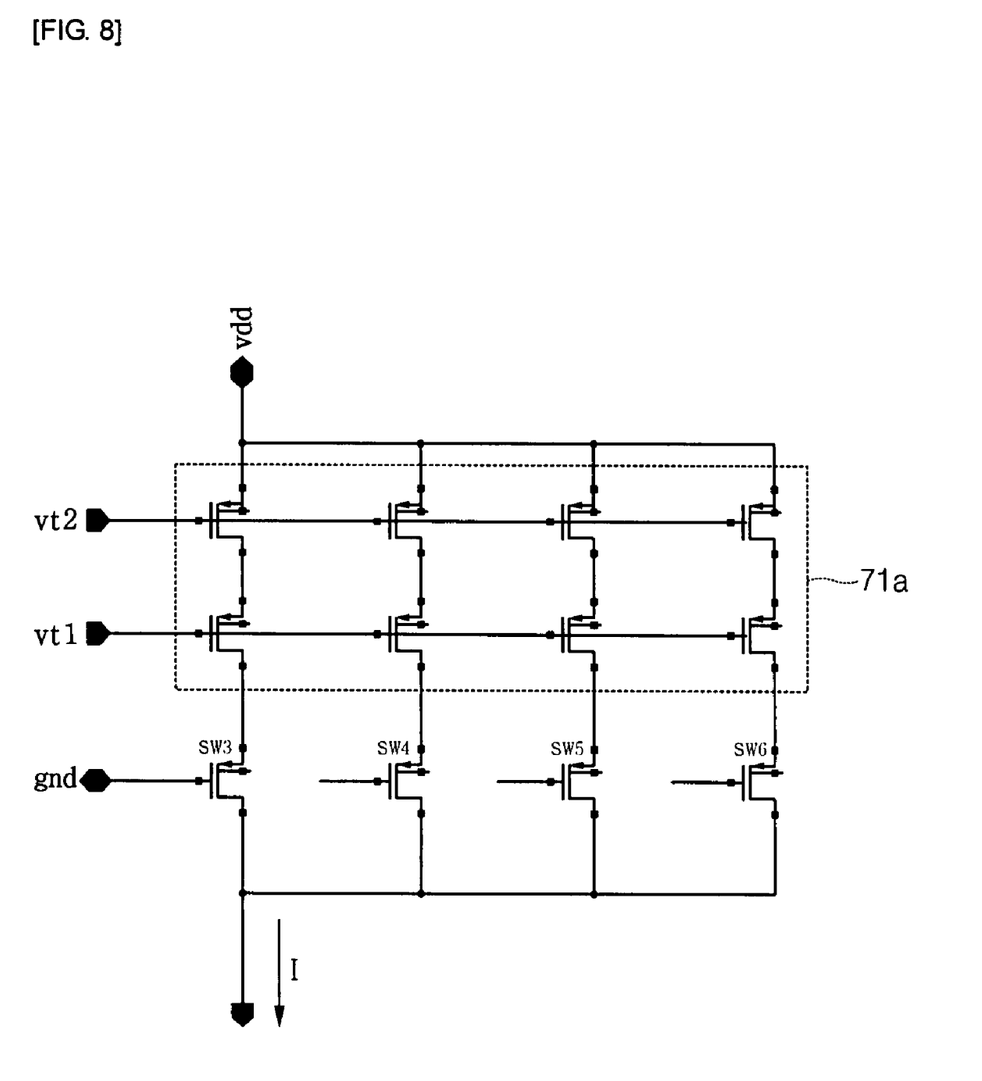
FIG. 8 is a circuit diagram of a bias current control section of FIGS. 7 and 9 according to the first and second embodiments.

FIG. 8 is a circuit diagram of the bias current control section of the invention. As shown in FIG. 8, the bias current control section 71 can be implemented by a plurality of MOS transistors. In FIG. 8, the descriptions will be focused on an embodiment using PMOS transistors. However, the invention is not limited to a specific type of MOS transistor. NMOS transistors or both of PMOS transistors and NMOS transistors can be used to implement substantially the same operation.

Referring to FIG. 8, a control process of bias current will be described as follows.

Sources vt1 and vt2 of bandgap reference (not shown) are mirrored through a current mirror 71a, and the plurality of MOS transistors control the mirrored current to thereby generate a bias current I.

At this time, the gate of a MOS transistor SW3 is grounded so that a constant current flows at all times. The magnitude of the bias current I can be controlled by controlling on/off operations of MOS transistors SW4 to SW6.

For example, if all the gates of the MOS transistors SW3 to SW6 are grounded, the MOS transistors SW4 and SW6 are turned on so that all currents flowing through the MOS transistors SW3 to SW6 become the bias current I. Therefore, the magnitude thereof becomes the maximum.

However, if a signal with a constant magnitude is applied to the MOS transistors S4 to S6, the MOS transistors SW4 to SW6 are all turned off so that only a current flowing through the switch SW3 becomes the bias current I. Therefore, the magnitude thereof becomes the minimum.

As such, when the gates of the switches SW4 to SW6 are grounded or a constant signal is applied to the gates, the magnitude of the bias current I generated in the bias current control section can be controlled.

Meanwhile, the first mirroring section 72 mirrors the bias current I output from the bias current control section 71, and the second mirroring section 73 connected to the first mirroring section 72 mirrors the bias current I mirrored by the first mirroring section 72.

The third mirroring section 74 connected to the second mirroring section 73 mirrors the bias current I mirrored by the second mirroring section 73 into the comparator 76.

The capacitor charging section 75 connected to the pulse control unit 60 charges the capacitor C with the signal S2 output from the pulse control unit 60 for predetermined charging time. At this time, the charging time of the capacitor C can be controlled by adjusting the bias current I of the bias current control section 71.

That is, the bias current I generated from the bias current control section 71 is mirrored into the capacitor charging section 75 by the first and second mirroring sections 72 and 73. Therefore, when the magnitude of the bias current I is adjusted, the charging time of the capacitor C can be controlled.

The capacitor charging section 75 includes first and second PMOS transistors P1 and P2. A signal output from the pulse control unit 60 is applied to the gates of the first and second PMOS transistors P1 and P2, and the sources thereof are connected to the second mirroring section 73. Further, the drain of the first PMOS transistor P1 is grounded, and the drain of the second PMOS transistor P2 is connected to the capacitor C.

At this time, when the signal S2 output from the pulse control unit 60 is switched from a high level to a low level, the second PMOS transistor P2 is turned on so as to charge the capacitor C.

The comparator 76 compares a voltage Vcap charged in the capacitor C and a reference voltage Vref generated by the bias current I mirrored through the third mirroring section 74.

The comparator 76 includes a third PMOS transistor P3 and a first NMOS transistor N1. The gate of the third PMOS transistor P3 receives a voltage Vcap charged in the capacitor C, the source thereof receives a power supply voltage, and the drain thereof is connected to the drain of the first NMOS transistor N1. The gate of the first NMOS transistor N1 receives the reference voltage Vref, the source thereof is grounded, and the drain thereof is connected to the drain of the third PMOS transistor P3.

Therefore, when the controlled charging time passes so that the voltage Vcap charged in the capacitor C becomes larger than the reference voltage Vref, the third PMOS transistor P3 is turned off and the first NMOS transistor is turned on so that the comparator 76 outputs a low-level signal. The inverter 77 inverts the low-level signal output from the comparator 76 and then outputs a high-level stabilization signal Sout to the CPU.

Second Embodiment

Figure 9:
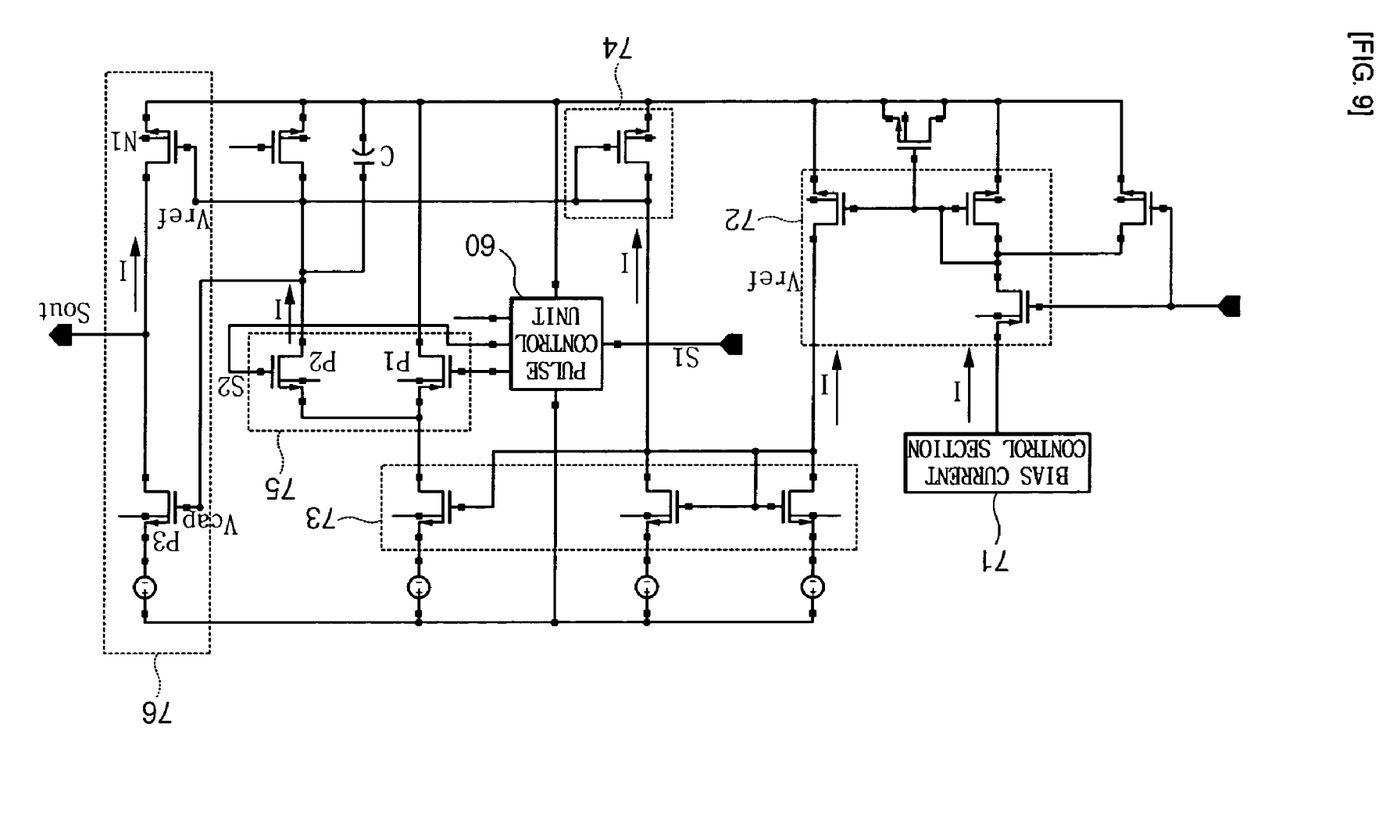
FIG. 9 is a circuit diagram of an oscillation stabilization detecting unit of FIG. 5A according to the second embodiment of the invention.

FIG. 9 is a circuit diagram of an oscillation stabilization detecting unit according to a second embodiment of the invention. As shown in FIG. 9, the oscillation stabilization detecting unit includes a capacitor C, a bias current control section 71, a first mirroring section 72, a second mirroring section 73, a third mirroring section 74, a capacitor charging section 75, and a comparator 76.

The bias current control section 71 generates a bias current I and controls the magnitude of the bias current I by using MOS transistors.

The configuration of the bias current control section 71 and a process where a bias current is controlled by the current control section 71 are the same as those of the first embodiment which have been described with reference to FIG. 8.

The first mirroring section 72 mirrors the bias current I output from the bias current control section 71, and the second mirroring section 73 connected to the first mirroring section 72 mirrors the bias current I mirrored by the first mirroring section 72.

The third mirroring section 74 connected to the second mirroring section 73 mirrors the bias current I, mirrored by the second mirroring section 73, into the comparator 76.

The capacitor charging section 75 connected to the pulse control unit 60 charges the capacitor C for charging time controlled by a signal S2 output from the pulse control unit 60. At this time, the charging time of the capacitor C can be controlled by adjusting the bias current I of the bias current control section 71.

That is, the bias current I generated from the bias current control section 71 is mirrored into the capacitor charging section 75 by the first and second mirroring sections 72 and 73. Therefore, when the magnitude of the bias current I is adjusted, the charging time of the capacitor C can be controlled.

The capacitor charging section 75 includes first and second PMOS transistors P1 and P2. The gates of the first and second PMOS transistors P1 and P2 receives a signal output from the pulse control unit 60, and the sources thereof are connected to the second mirroring section 73. The drain of the first PMOS transistor P1 is grounded, and the drain of the second PMOS transistor P2 is connected to the capacitor C.

At this time, when the signal S2 output from the pulse control unit 60 is switched from a high level to a low level, the second PMOS transistor P2 is turned on so as to charge the capacitor C.

The comparator 76 compares a voltage Vcap charged in the capacitor C with a reference voltage Vref generated by the bias current I mirrored through the third mirroring section 74 and then outputs a stabilization signal to the CPU, the stabilization signal representing that the oscillation signal is stabilized.

The comparator 76 includes a third PMOS transistor P3 and a first NMOS transistor N1. The gate of the third PMOS transistor P3 receives the voltage Vcap charged in the capacitor C, the source thereof receives a power supply voltage, and the drain thereof is connected to the drain of the first NMOS transistor N1. The gate of the first NMOS transistor N1 receives the reference voltage Vref, the source thereof is grounded, and the drain thereof is connected to the drain of the third PMOS transistor.

Therefore, when the controlled charging time passes so that the voltage Vcap charged in the capacitor C becomes larger than the reference voltage Vref, the third PMOS transistor P3 is turned off and the first NMOS transistor N1 is turned on so that the comparator 76 outputs a low-level stabilization signal to the CPU.

Figure 10:
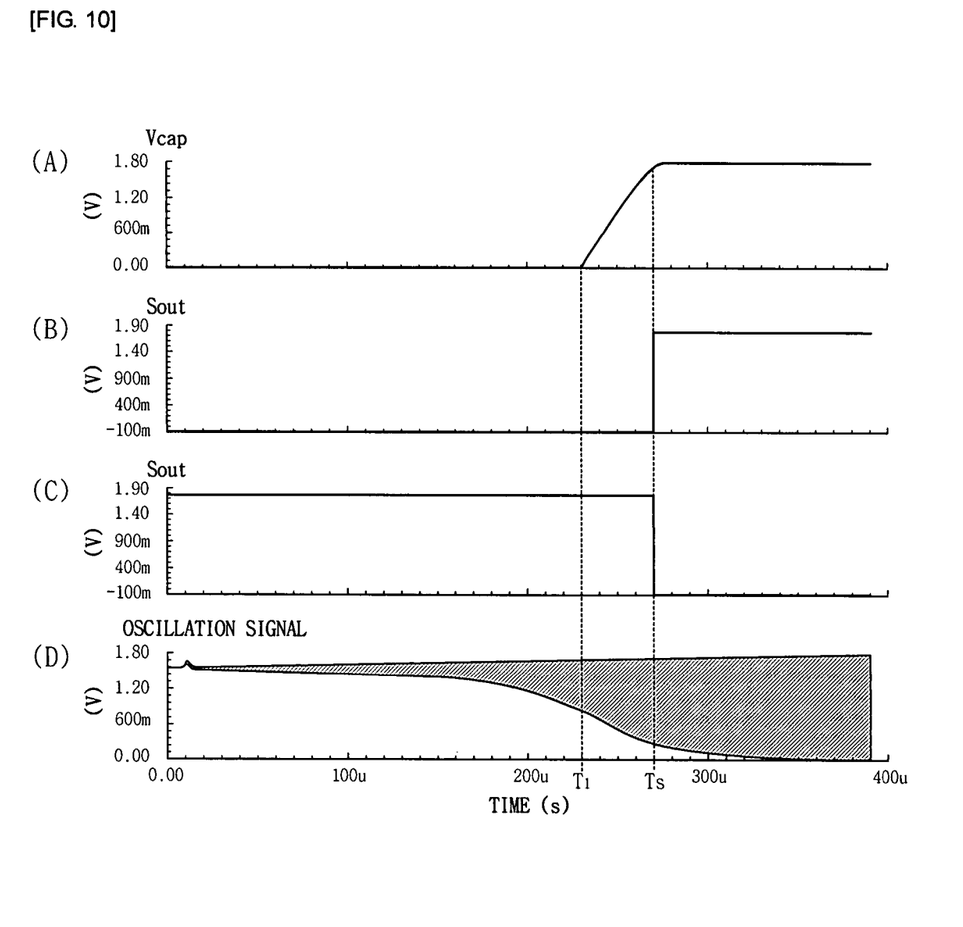
FIG. 10A shows voltages charged in the capacitors of the first and second embodiments.
FIG. 10B shows a stabilization signal of the first embodiment.
FIG. 10C shows a stabilization signal of the second embodiment.
FIG. 10D shows oscillation signals of the first and second embodiments.

FIGS. 10A to 10D are graph showing simulation results of the first and second embodiments. FIG. 10A shows voltages charged in the capacitors of the first and second embodiments, FIG. 10B shows a stabilization signal of the first embodiment, FIG. 10C shows a stabilization signal of the second embodiment, and FIG. 10D shows oscillation signals of the first and second embodiments.

As shown in FIGS. 10A to 10C, it can be found that, after the charging time of the capacitor (T1 to Ts) passes, the stabilization signal is output, the stabilization signal representing that the oscillation signal is stabilized. Further, as shown in FIG. 10D, it can be found that the oscillation signal is stabilized almost at the same time when the stabilization signal is output.

As shown in FIG. 10A, the oscillation signal is stabilized from the moment Ts when the charging of the capacitor is terminated. Therefore, if the bias current is controlled so as to advance the capacitor charging time (T1 to Ts), the time at which the oscillation signal is stabilized is also advanced.

Further, the capacitor charging time (T1 to Ts) can be controlled through the control of the bias current, and thus the time at which the oscillation signal is stabilized can be also controlled. Therefore, accurate stabilization time Ts can be detected and can be noticed to the CPU.

Accordingly, the CPU can operate accurately from the stabilization time such that time wasted for the operation of the CPU is significantly reduced. As a result, it is possible to enhance operational efficiency of the CPU.

According to the invention, the oscillation stabilization detecting circuit adjusts a bias current so as to control the time at which the oscillation signal is stabilized. Therefore, it is possible to advance the time for the stabilization of oscillation signal.

Further, as the bias current is adjusted so as to control the time at which the oscillation signal is stabilized, accurate stabilization time can be detected and can be noticed to the CPU. As a result, it is possible to enhance operational efficiency of the CPU.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An oscillation stabilization detecting circuit comprising:
a T flip flop receiving a pulse-type oscillation signal generated by oscillating a crystal oscillator and then dividing the oscillation signal to output;
a pulse control unit including inverters and transistors, the pulse control unit converting the signal output from the T flip flop into a pulse-type signal starting from a high level and then outputting the converted signal; and
an oscillation stabilization detecting unit including:
a capacitor charged with the signal output from the pulse control unit; and
a plurality of transistors,
wherein the oscillation stabilization detecting unit controls charging time of the capacitor by adjusting a bias current and, after the charging time passes, outputs a stabilization signal to a CPU, the stabilization signal representing that the oscillation signal is stabilized.

2. The oscillation stabilization detecting circuit according to claim 1,
wherein each of the transistors is provided with first to third terminals,
based on the magnitude of a voltage applied between the first and second terminals, the magnitude and direction of a current flowing from the second terminal to the third terminal are changed, and
the first to third terminals are a gate, a source, and a drain, respectively.

3. The oscillation stabilization detecting circuit according to claim 2,
wherein the oscillation stabilization detecting unit includes:
a capacitor;
a bias current control section generating a bias current and controlling the magnitude of the bias current by using transistors;
a first mirroring section mirroring the bias current output from the bias current control section;
a second mirroring section connected to the first mirroring section and mirroring the bias current mirrored by the first mirroring section;
a third mirroring section connected to the second mirroring section and mirroring the bias current mirrored by the second mirroring section;
a capacitor charging section connected to the pulse control unit so as to charge the capacitor for the charging time controlled by the signal output from the pulse control unit;
a comparator comparing the voltage charged in the capacitor with a reference voltage generated by the bias current mirrored through the third mirroring section; and
an inverter inverting the signal output from the comparator and then outputting a stabilization signal to a CPU, the stabilization signal representing that the oscillation signal is stabilized.

4. The oscillation stabilization detecting circuit according to claim 3,
wherein the capacitor charging section includes first and second PMOS transistors, the gates of the first and second PMOS transistors receive a signal output from the pulse control unit, the sources thereof are connected to the second mirroring section, the drain of the first PMOS transistor is grounded, and the drain of the second PMOS transistor is connected to the capacitor.

5. The oscillation stabilization detecting circuit according to claim 4,
wherein when the signal output from the pulse control unit is switched from a high level to a low level, the second PMOS transistor is turned on to charge the capacitor.

6. The oscillation stabilization detecting circuit according to claim 3,
wherein the comparator includes a third PMOS transistor and a first NMOS transistor,
the gate of the third PMOS transistor receives the voltage charged in the capacitor,
the source thereof receives a power supply voltage,
the drain thereof is connected to the drain of the first NMOS transistor,
the gate of the first NMOS transistor receives the reference voltage,
the source thereof is grounded, and
the drain thereof is connected to the drain of the third PMOS transistor.

7. The oscillation stabilization detecting circuit according to claim 6,
wherein when the voltage charged in the capacitor is larger than the reference voltage, the third PMOS transistor is turned off and the first NMOS transistor is turned on so that the comparator outputs a low-level signal.

8. The oscillation stabilization detecting circuit according to claim 7,
wherein the inverter outputs a high-level stabilization signal to the CPU.

9. The oscillation stabilization detecting circuit according to claim 2,
wherein the oscillation stabilization detecting unit includes:
a capacitor;
a bias current control section generating a bias current and controlling the magnitude of the bias current by using transistors;
a first mirroring section mirroring the bias current output from the bias current control section;
a second mirroring section connected to the first mirroring section and mirroring the bias current mirrored by the first mirroring section;
a third mirroring section connected to the second mirroring section and mirroring the bias current mirrored by the second mirroring section;
a capacitor charging section connected to the pulse control unit so as to charge the capacitor for the charging time controlled by the signal output from the pulse control unit; and
a comparator comparing the voltage charged in the capacitor with a reference voltage generated by the bias current mirrored through the third mirroring section and then outputting a stabilization signal to a CPU, the stabilization signal representing that the oscillation signal is stabilized.

10. The oscillation stabilization detecting circuit according to claim 9,
wherein the capacitor charging section includes first and second PMOS transistors,
the gates of the first and second PMOS transistors receive a signal output from the pulse control unit,
the sources thereof are connected to the second mirroring section,
the drain of the first PMOS transistor is grounded, and
the drain of the second PMOS transistor is connected to the capacitor.

11. The oscillation stabilization detecting circuit according to claim 10,
wherein when the signal output from the pulse control unit is switched from a high level to a low level, the second PMOS transistor is turned on to charge the capacitor.

12. The oscillation stabilization detecting circuit according to claim 9,
wherein the comparator includes a third PMOS transistor and a first NMOS transistor,
the gate of the third PMOS transistor receives the voltage charged in the capacitor,
the source thereof receives a power supply voltage,
the drain thereof is connected to the drain of the first NMOS transistor,
the gate of the first NMOS transistor receives the reference voltage,
the source thereof is grounded, and
the drain thereof is connected to the drain of the third PMOS transistor.

13. The oscillation stabilization detecting circuit according to claim 12,
wherein when the voltage charged in the capacitor is larger than the reference voltage, the third PMOS transistor is turned off and the first NMOS transistor is turned on so that the comparator outputs a low-level stabilization signal to the CPU.

* * * * *